United States Patent
Iwasaki et al.

(10) Patent No.: US 12,271,111 B2
(45) Date of Patent: Apr. 8, 2025

(54) TEMPLATE, MANUFACTURING METHOD OF TEMPLATE, AND MANUFACTURING METHOD OF SEMICONDUCTOR DEVICE

(71) Applicant: KIOXIA CORPORATION, Tokyo (JP)

(72) Inventors: Takahiro Iwasaki, Yokohama Kanagawa (JP); Hirokazu Miyoshi, Kamakura Kanagawa (JP); Shogo Aso, Yokohama Kanagawa (JP); Masayuki Hatano, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 1073 days.

(21) Appl. No.: 17/190,083

(22) Filed: Mar. 2, 2021

(65) Prior Publication Data

US 2022/0082934 A1    Mar. 17, 2022

(30) Foreign Application Priority Data

Sep. 14, 2020   (JP) .................................. 2020-153713

(51) Int. Cl.
  *G03F 7/00*    (2006.01)
  *B29C 33/38*   (2006.01)
  *H01L 21/027*  (2006.01)

(52) U.S. Cl.
  CPC ........ *G03F 7/0002* (2013.01); *B29C 33/3842* (2013.01); *H01L 21/0271* (2013.01)

(58) Field of Classification Search
  CPC ............... G03F 7/0002; B29C 33/3842; H01L 21/0271
  See application file for complete search history.

(56) References Cited

U.S. PATENT DOCUMENTS

| | | | | |
|---|---|---|---|---|
| 2007/0243279 A1* | 10/2007 | McMackin | ............ | B82Y 10/00 425/385 |
| 2010/0264113 A1* | 10/2010 | Yoneda | .................. | B82Y 40/00 264/494 |
| 2012/0040041 A1* | 2/2012 | Tsuji | ...................... | B82Y 10/00 425/385 |
| 2014/0072668 A1* | 3/2014 | Yoneda | .................. | B29C 59/02 428/157 |
| 2019/0263024 A1 | 8/2019 | Kobayashi et al. | | |

FOREIGN PATENT DOCUMENTS

| | | |
|---|---|---|
| JP | 2017-168833 A | 9/2017 |
| JP | 2018-113347 A | 7/2018 |
| JP | 2018-157144 A | 10/2018 |
| WO | 2007-099907 A1 | 9/2007 |

* cited by examiner

*Primary Examiner* — John P. Dulka
(74) *Attorney, Agent, or Firm* — Kim & Stewart LLP

(57) ABSTRACT

According to one embodiment, an imprint template includes a substrate having a first surface and a mesa part protruding from the first surface. The mesa part has a second surface with a pattern thereon. The mesa part includes a sloped region. The sloped region is on at least an outer circumferential portion of the second surface. The second surface in the sloped region slopes downward towards the first surface to an outer edge of the mesa part when the substate is in a non-pressurized state.

17 Claims, 11 Drawing Sheets

TEMPLATE, MANUFACTURING METHOD OF TEMPLATE, AND MANUFACTURING METHOD OF SEMICONDUCTOR DEVICE

CROSS-REFERENCE TO RELATED APPLICATION(S)

This application is based upon and claims the benefit of priority from Japanese Patent Application No. 2020-153713, filed Sep. 14, 2020, the entire contents of which are incorporated herein by reference.

FIELD

Embodiments described herein relate generally to a template for imprint lithography applications, a manufacturing method of such a template, and a manufacturing method of a semiconductor device utilizing such a template.

BACKGROUND

Techniques using nanoimprint lithography (NIL) for forming a fine pattern in a manufacturing process of semiconductor devices are known. A pattern may be formed by NIL in a process as follows. An imprint material layer of ultraviolet curable resin or the like is formed on a processing target object by an ink jetting method or a spin coating method. A template is then pressed or stamped onto the imprint material layer, and this imprint material layer is cured with light, whereby a pattern from the template is transferred to the imprint material layer. In such a NIL process, it is desired to reduce failure due to inclusion of bubbles between a template and an imprint material layer, and other causes.

DETAILED DESCRIPTION

Embodiments provide a template that is less prone to cause imprint failures or defects caused by the inclusion of bubbles and other causes in a NIL process. A manufacturing method of such a template, and moreover, a manufacturing method of a semiconductor device using such a template are described.

In general, according to one embodiment, an imprint template includes a substrate having a first surface and a mesa part protruding from the first surface. The mesa part has a second surface with a pattern thereon. The mesa part includes a sloped region. The sloped region is on at least an outer circumferential portion of the second surface. The second surface in the sloped region slopes downward towards the first surface to an outer edge of the mesa part when the substate is in a non-pressurized state.

Hereinafter, a template of an embodiment, a manufacturing method of a template, and a manufacturing method of a semiconductor device will be described with reference to the drawings. In each embodiment, parts or aspects that are substantially the same as other embodiments previously described are given the same reference symbols, and descriptions of such already described aspect may be omitted in some instance. The drawings show schematic examples, which differ from actual objects in relationships between thicknesses and plane dimensions, ratios of thicknesses of parts, and so on. Unless otherwise clearly noted, the words showing directions, such as upper and lower, in the description, represent relative directions when a surface provided with a mesa part of a template is an upper surface. These directions may be different from directions that are based on a direction of gravitational acceleration.

First Embodiment

Figure 1:
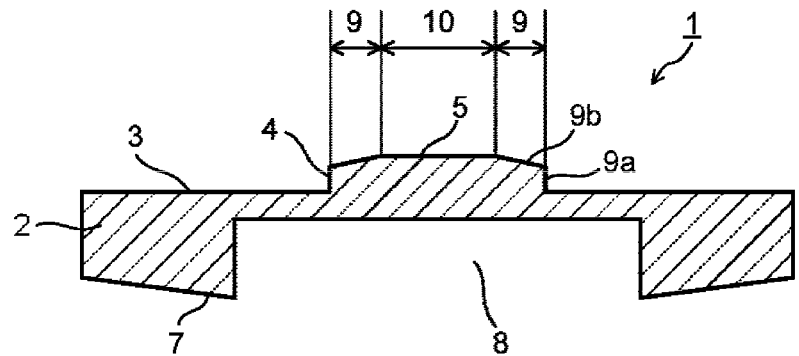
FIG. 1 is a cross-sectional view showing a template of an embodiment.
Figure 2:
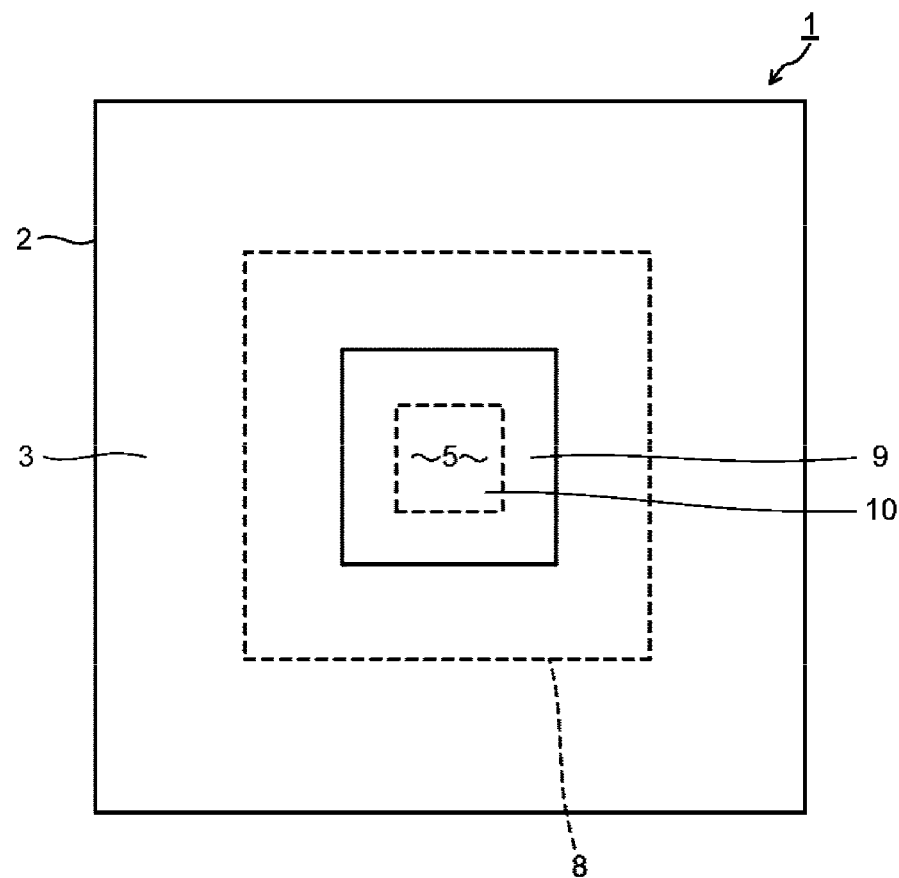
FIG. 2 is a plan view of the template depicted in FIG. 1.
Figure 3:
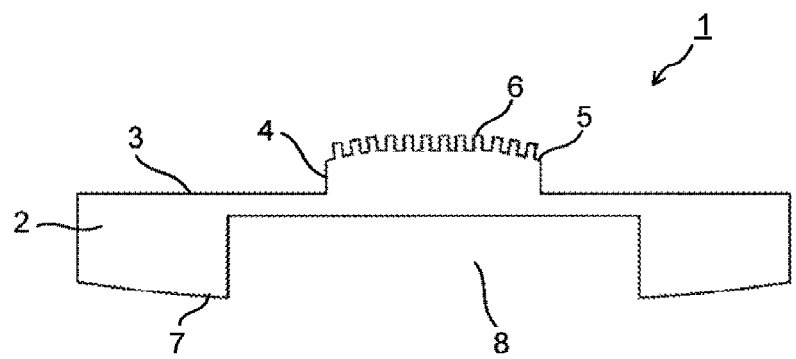
FIG. 3 depicts a template that has a pattern of recesses and projections on a surface thereof.

A template of an embodiment and a manufacturing method thereof will be described with reference to the drawings. FIG. 1 is a cross-sectional view showing a template of an embodiment. FIG. 2 is a plane view showing the template of the embodiment. FIG. 3 shows a state where the template in FIG. 1 has a recess and projection pattern. A pattern is formed by means of NIL in a NIL process as follows. For example, an imprint material layer of thermosetting resin, ultraviolet curable resin, or the like, is formed on a processing target object by an ink jetting method or a spin coating method. A mold or a template is pressed or stamped onto the imprint material layer, and this imprint material layer is cured by applying heat or emitting light thereto, whereby a pattern is transferred to the imprint material layer. The template of the embodiment is used as the mold for transferring a pattern in the NIL process.

A template 1 shown in FIGS. 1 and 2 includes a substrate 2 made of quartz glass or the like. The substrate 2 is composed of a single component such as quartz glass. One of surfaces of the substrate 2 constitutes a first surface 3 which may be referred to as an off-mesa part or surface. A mesa part 4 is provided at a central portion of the first surface 3 in such a manner as to protrude from the first surface 3. An upper surface of the mesa part 4 constitutes a second surface 5. Although not explicitly shown in FIGS. 1 and 2, the second surface 5 of the mesa part 4 has a recess and projection pattern 6, as shown in FIG. 3. The recess and projection pattern 6 (referred to as "pattern 6" for simplicity) is provided in or on the second surface 5. The pattern 6 is the pattern to be transferred to an imprint material layer in the NIL process. The other surface of the substrate 2 is a third surface 7, to which a recess 8 is provided as a countersink. The third surface 7 or the third surface 7 side of the substrate 2 may be referred to as a backside of the substrate 2.

In a NIL process employing a spin coating method to form an imprint material layer (hereinafter may be referred to as a "spin coating NIL process"), an imprint material layer is formed on the whole processing target surface of a processing target object in advance. In a NIL process employing an ink jetting method (hereinafter may be referred to as an "ink jetting NIL process"), droplets are applied to a processing target surface in particular positions, and a template is pressed onto the droplets. Thus, this process requires time for the droplets to spread to and fill the entire pattern. Compared with this process, the spin coating NIL process can reduce filling time of an imprint material in a pattern. However, in the spin coating NIL process, since the filling time is reduced, inclusion of bubbles at an outer circumferential part of a pattern of a template tends to occur. This is because, in the condition where a pressing speed of the template is increased, an outer circumference of a mesa part comes into contact with an imprint material layer first, before the center of the mesa part comes into contact with the imprint material layer. Thus, air is trapped in the recess and projection pattern on the mesa part. The air that is trapped in the recess and projection pattern causes stamping failure or filling failure.

In consideration of this, the template 1 of the present embodiment is provided with a slope region 9 in the mesa part 4. The slope region 9 is provided to at least an outer circumferential region of the second surface 5. In the slope region 9, a height of the mesa part 4, that is, a height to the second surface 5 relative to the first surface 3, decreases towards an outer perimeter of the mesa part 4 when in a non-pressurized state. The non-pressurized state means a state where pressure exceeding atmospheric pressure is not being applied to the template 1 from outside. FIG. 1 shows a mesa part 4 in which a slope region 9 is provided only for an outer circumferential region of the second surface 5 and a flat region 10 is provided in a central portion of the mesa part 4 inside the slope region 9. The flat region 10 shown in FIG. 1 has a flat surface parallel to the first surface 3. The pattern 6 of the mesa part 4 (shown in FIG. 3) is formed in both the flat region 10 and the slope region 9. However, the pattern 6 that is in the slope region 9 is somewhat angled with respect the flat region 10, but is approximately perpendicular to the surface of the slope region 9. This surface of the slope region 9 is referred to as a slope surface 9b.

The slope region 9 prevents the outer circumferential region of the mesa part 4 from coming into contact with an imprint material layer until after a central region (e.g., flat region 10) of the mesa part 4 comes into contact with the imprint material layer when the pattern 6 is pressed onto the imprint material layer. That is, after the center of the mesa part 4 comes into contact with the imprint material layer, the outer circumferential region of the mesa part 4 is still initially at a position away from the imprint material layer due to the sloping of slope region 9 away from the imprint material layer. Thus, the mesa part 4 gradually comes into contact with the imprint material layer starting from the vicinity of the center of the mesa part 4, and then finally the slope region 9 is deformed by the imprint pressing force and comes into contact with the imprint material layer. As a result, the mesa part 4 comes into contact with the imprint material layer starting from the center moving towards the outer circumference of the mesa part 4, whereby trapping of air between the pattern 6 of the mesa part 4 and the imprint material layer is reduced or prevented. Accordingly, it is possible to prevent stamping failure, filling failure, and the like, due to air that is trapped in the recess and projection pattern, in particular, due to air that might otherwise get trapped in the outer circumferential region of the mesa part 4.

In the mesa part 4 having the slope region 9, the pattern 6 is provided in the second surface 5 of the mesa part 4, including in the slope region 9. As such, the desired pattern shape will be transferred to an imprint material layer by the pattern on the slope region 9 when the mesa part 4 is deformed by the pressing force applied to the mesa part 4. Thus, although the slope region 9 is deformed by the pressing force to the mesa part 4, the exact pattern 6 that is required in a processing target object can still be transferred to an imprint material layer.

Figure 4:
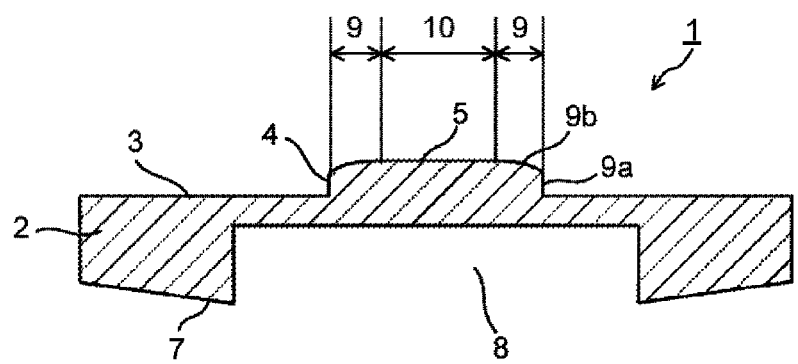
FIG. 4 depicts a first modification example of a template of an embodiment.
Figure 5:
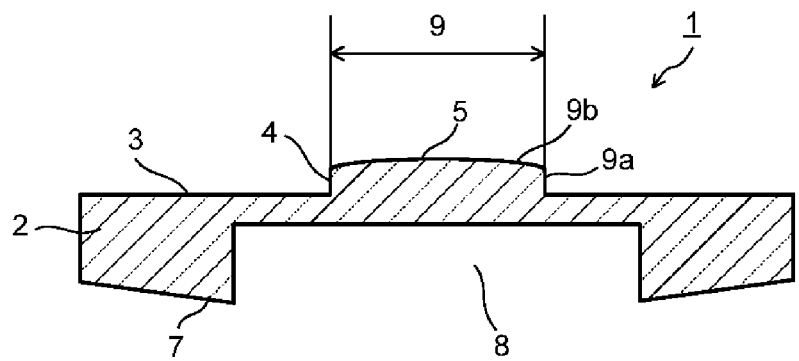
FIG. 5 depicts a second modification example of a template of an embodiment.

The slope region 9 of the mesa part 4 shown in FIG. 1 has a height that linearly reduces from the flat region 10 to the outer circumference of the mesa part 4. However, the shape of the slope region 9 is not limited to this. For example, as shown in FIG. 4, the slope region 9 may have an outwardly convex shape and may have a height that lowers towards the outer circumference of the mesa part 4 in accordance with this curved shape. As in the case of the mesa part 4 shown in FIG. 1, the mesa part 4 shown in FIG. 4 has a flat region 10 that is provided within the curved slope region 9. In another example, as shown in FIG. 5, the slope region 9 may be formed in such a manner that the whole second surface 5 of the mesa part 4 is curved, and the slope region 9 may have a height that lowers from the center to the outer circumference of the mesa part 4 in accordance with the curved shape of the whole second surface 5. The mesa part 4 shown in FIG. 5 does not necessarily have a flat region. That is, the second surface 5 of the mesa part 4 may have such a gradually curving shape. However, the mesa part 4 preferably has both of the slope region 9 as an outer circumferential region and a flat region 10 that is provided within the slope region 9 as a central portion of the second surface 5.

Providing the flat region 10 to the second surface 5 of the mesa part 4 in addition to the slope region 9 enables enhancing characteristics of transferring the recess and projection pattern 6 to an imprint material layer in the NIL process. In this state, assuming that an area of the flat region 10 is S1, an area projected to a plane parallel to the flat region 10 of the slope region 9 is S2, and the total of the areas S1 and S2 is 100, the area S2 preferably satisfies a relationship of $0<S2\leq20$. In the condition where the area S2 exceeds 0, the slope region 9 is provided. This more effectively prevents the outer circumferential region of the second surface 5 from coming into contact with an imprint material layer too early in the NIL process. However, in the condition where the area S2 exceeds 20, the characteristics of transferring the pattern 6 to an imprint material layer may not be sufficiently enhanced.

The mesa part 4 shown in FIG. 1 preferably has a rising surface 9a and a slope surface 9b. As shown in the enlarged part of the mesa part 4 in FIGS. 6 and 7, the rising surface 9a extends in a direction in which the slope region 9 crosses the first surface 3, for example, a perpendicular direction from the first surface 3, and the slope surface 9b slopes in a direction from an end of the rising surface 9a toward the center of the second surface 5 or slopes to the flat region 10 in FIG. 1. The slope region 9 of the mesa part 4 shown in FIG. 4 also has a rising surface 9a and a slope surface 9b, as in the case of the slope region 9 shown in FIGS. 1, 6, and 7, although they differ from each other in that the surface is flat or curved. The slope region 9 of the mesa part 4 shown in FIG. 5 also has a rising surface 9a and a slope surface 9b, as in the case of the slope region 9 shown in FIGS. 1, 6, and 7, although the slope region 9 in FIG. 5 differs from them in the formed area, that is, the slope region 9 in FIG. 5 does not have a flat region but is provided over the whole second surface 5.

Figure 6:
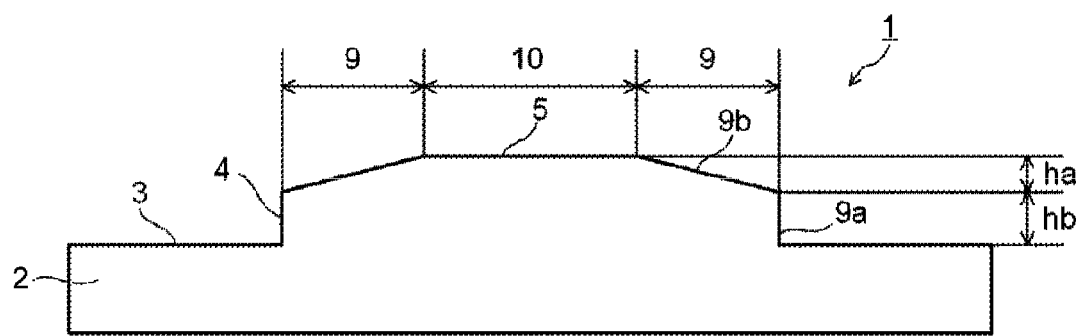
FIG. 6 depicts an enlarged portion of a template of an embodiment.
Figure 7:
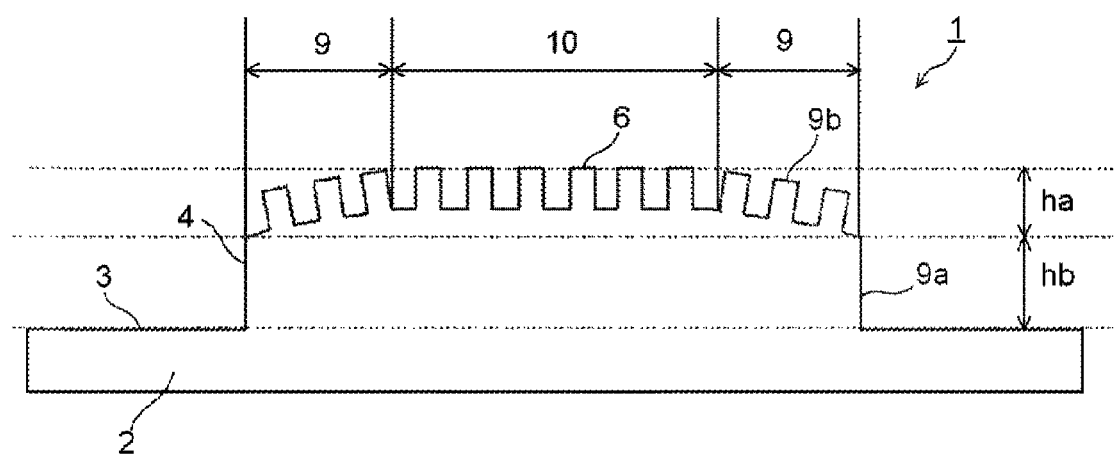
FIG. 7 depicts an enlarged portion of a template having a pattern thereon.

The slope region 9 of the mesa part 4 has the rising surface 9a, which is provided in the direction crossing the first surface 3, and has the slope surface 9b, which is provided in the direction from the end of the rising surface 9a toward the center of the second surface 5, for example, in the direction to the flat region 10 in FIGS. 1, 6, and 7. Such a shape enables adjusting the slope angle of the slope surface 9b to an appropriate range while obtaining a desired total height of the mesa part 4. That is, a too large slope angle of the slope surface 9b may prevent the pattern 6 from being correctly transferred to an imprint material layer even in the case of deforming the slope region 9 by pressing force to the mesa part 4. In view of this, the slope region 9 preferably has a shape as described below.

Assuming that a height from an intersection part between the rising surface 9a and the slope surface 9b to the highest part of the mesa part 4 is ha, and a height of the rising surface 9a is hb, as shown in FIGS. 6 and 7, the height ha preferably is in a range of greater than 0% but 20% or less of the height hb. In the condition where the height ha is greater than 0% with respect to the height hb, the outer circumferential region of the second surface 5 of the mesa part 4 is sloped. More preferably, the height ha is 0.01% or greater with respect to the height hb. This more effectively prevents the outer circumferential region of the second surface 5 from coming into contact with an imprint material layer at too early in the NIL process. However, if the height ha exceeds 20% of the height hb, the recess and projection pattern 6 of the mesa part 4 may not be correctly transferred to an imprint material layer in the NIL process, and it is difficult to make the total height of the mesa part 4 high enough.

Figure 8:
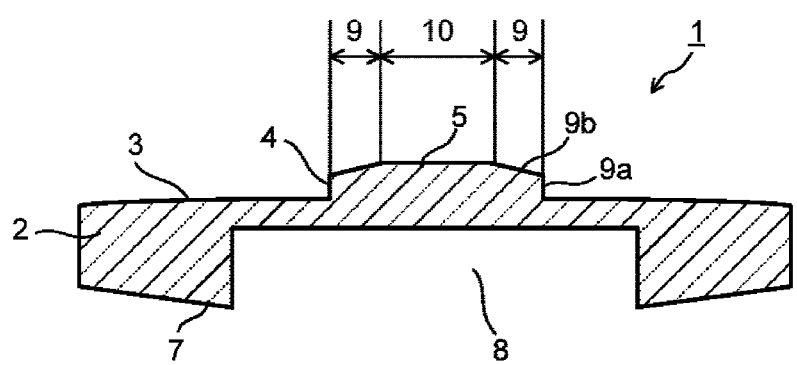
FIG. 8 depicts a third modification example of a template of an embodiment.

The shape of the template 1 is not limited to the specific shapes described above. The first surface 3 being the off-mesa part corresponding to a base of the mesa part 4 is not limited to a flat surface, as shown in FIG. 1. The template 1 may have a curved first surface 3, as shown in FIG. 8. The shape of the first surface 3 being the off-mesa part can be appropriately selected in accordance with such things as the apparatus to be used for pressing the template 1 onto an imprint material layer. The same applies to the templates 1 shown in FIGS. 4 and 5, and they may have the curved first surface 3, as shown in FIG. 8. The shape of the template 1 can be set by variously combining the shapes of the parts shown in FIGS. 1, 3, 4, and 5.

Figure 9:
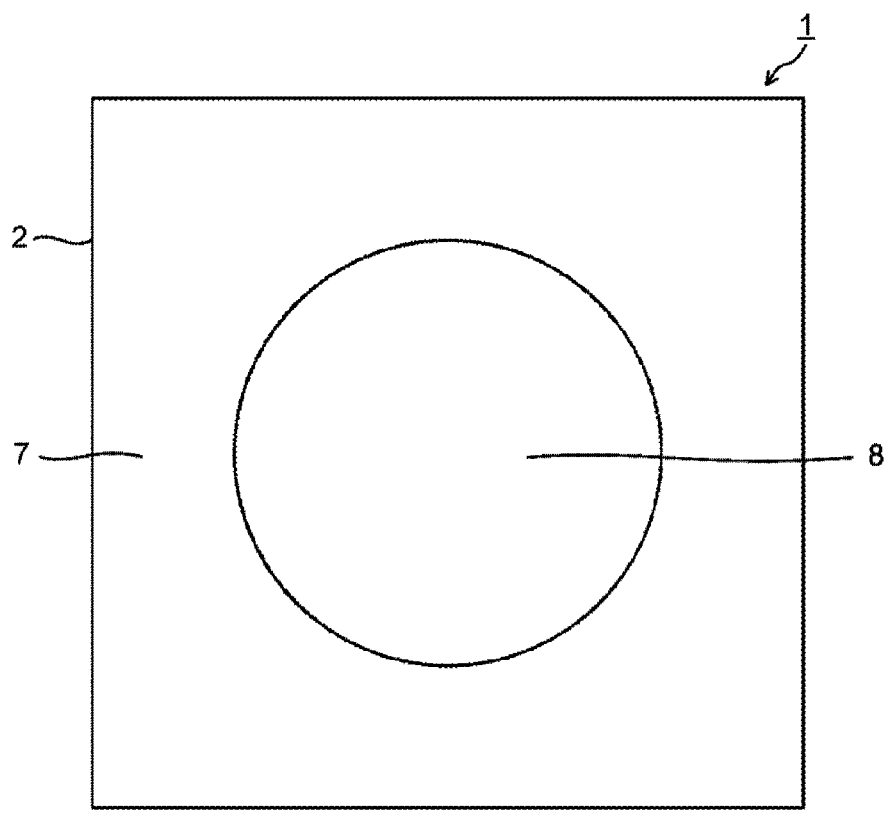
FIG. 9 is a backside view of the template depicted in FIG. 1.
Figure 10:
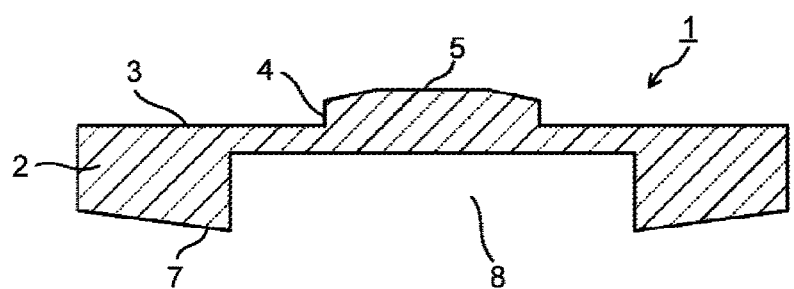
FIG. 10 is a cross-sectional view depicting a recess in a template of an embodiment.
Figure 11:
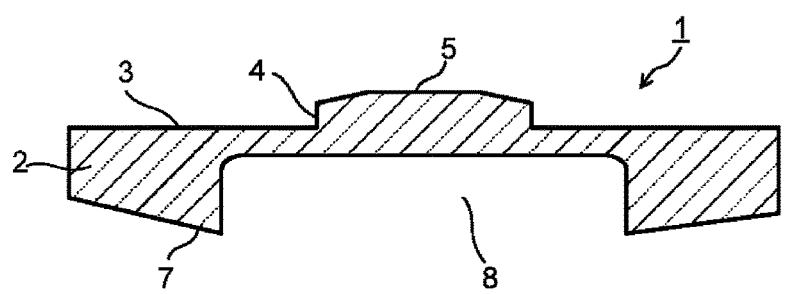
FIG. 11 depicts a first modification example of a recess.

The recess 8, which is provided in the third surface 7 corresponding to the back surface of the template 1, can have a corresponding shape of each type of template 1. The recess 8 that is provided to the third surface 7 has a function as described below. In the NIL process, when pressing the template 1, the template 1 is brought into contact with an imprint material layer in a state in which the template 1 is somewhat expanded into a protruding shape by pressurizing the recess 8 (e.g., increasing the pressure in the recess 8 relative to the front side of the template 1 or the like). Thereafter, while the pressure applied to the recess 8 is maintained, the whole template 1 is applied with force and pressed onto the imprint material layer in such a manner that the whole mesa part 4 of the template 1 comes into contact imprint material layer. The template 1 that is used in this manner may have a recess 8 with a shape as shown in FIGS. 9 and 10, for example. FIG. 9 is a backside view of the template 1. The recess 8 shown in FIGS. 9 and 10 has a general planar shape formed into a circle and has a cross sectional shape of a quadrangle. Although a corner on the upper surface side has a right angle in the recess 8 depicted in FIG. 10, the recess 8 cross sectional shape is not limited to this, and such a corner may be curved, as shown in FIG. 11.

Figure 12:
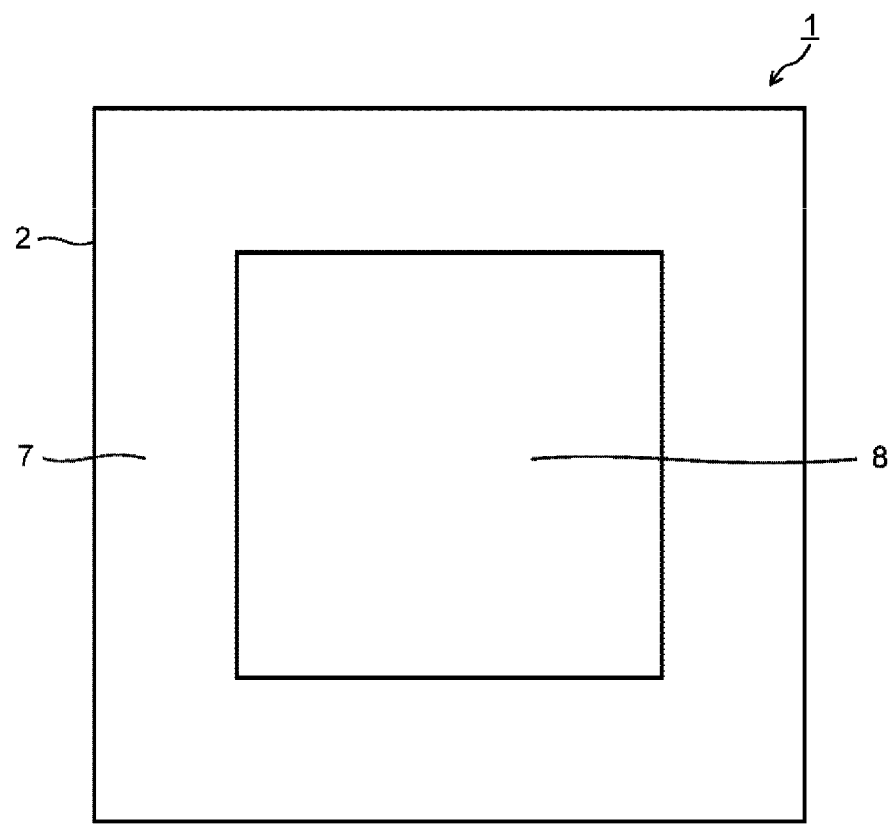
FIG. 12 is a backside view depicting a first modification example of the template in FIG. 9.
Figure 13:
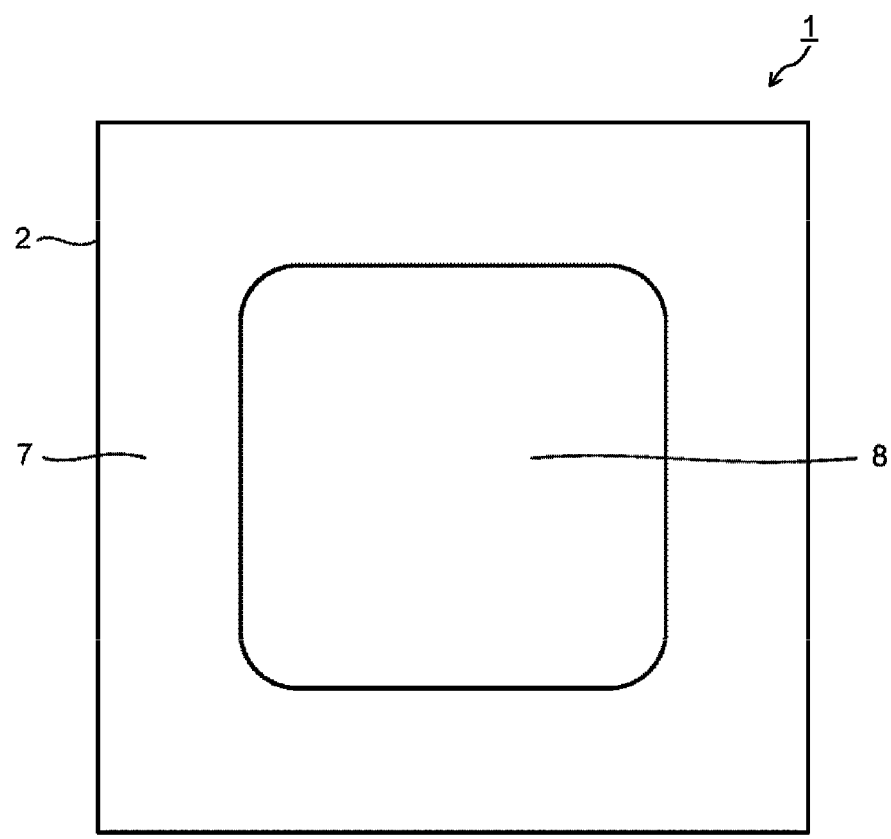
FIG. 13 is a backside view depicting a second modification example of the template in FIG. 9.

In another example, the recess 8 may have a planar shape of a quadrangle, as shown in FIGS. 12 and 13. The planar shape of the recess 8 is not limited to the square shown in FIGS. 12 and 13 and may be rectangular, for example. The recess 8 that has a planar shape formed approximately into a quadrangle, such as a square or a rectangle, generally reduces stamping failure of the template 1. Thus, this recess 8 can be effectively used in the template 1 of an embodiment. The corner in the planar shape of the recess 8 is not limited to a right angle as shown in FIG. 12, and such a corner may be curved as shown in FIG. 13. Moreover, the corner on the upper surface side of this recess 8 may be curved, as in the case of the recess 8 in FIG. 11. Curving the corner in the plane shape or in the cross-sectional shape of the recess 8 further enhances the effect for reducing stamping failure of the template 1. The shape of the recess 8 is not limited to the shapes shown in FIGS. 9 to 13, and various shapes that might reduce stamping failures in certain contexts may be used as appropriate.

Figure 14A:
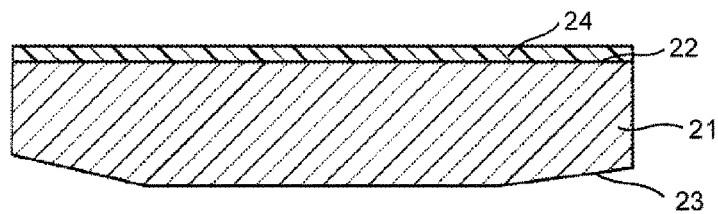
FIGS. 14A to 14G are cross-sectional views depicting aspects of a process for manufacturing a template of an embodiment.
Figure 14B:
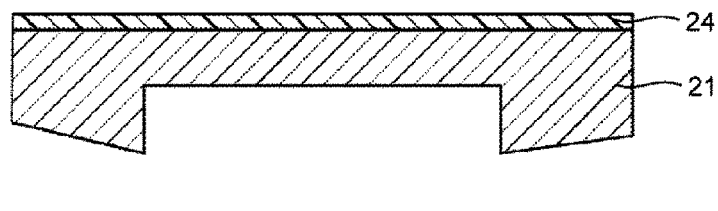

Next, a method for manufacturing the template 1 will be described with reference to FIGS. 14A to 16. First, as shown in FIG. 14A, a glass material 21 to be used as the substrate 2 of the template 1 is prepared. The glass material 21 has a flat first surface 22 and a protruding second surface 23, as shown in FIG. 14A. The shape of the glass material 21 is not limited to this, and the glass material 21 may have a protruding first surface 22 and a protruding second surface 23, as shown in FIG. 15. A protective resin film 24 is formed on the first surface 22 of the glass material 21. As shown in FIG. 14B, a recess 8 is formed on the second surface 23, as a countersink.

Figure 16:
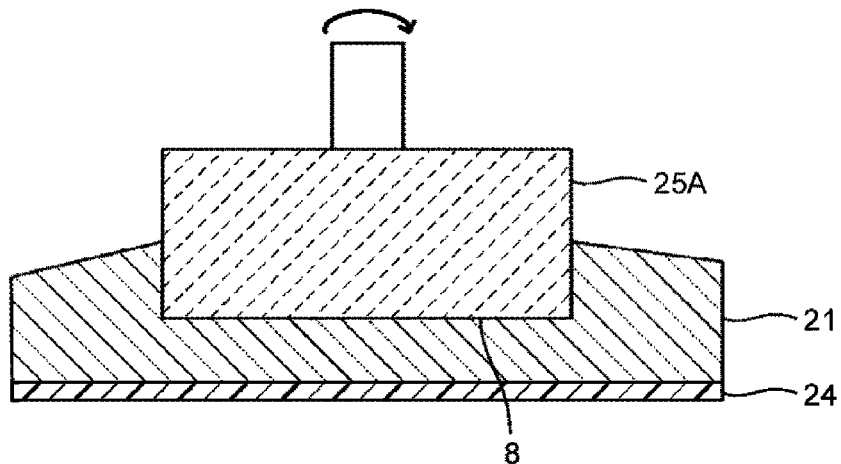
FIG. 16 is a cross-sectional view showing a first forming example of a recess for a process for manufacturing a template of an embodiment.
Figure 17:
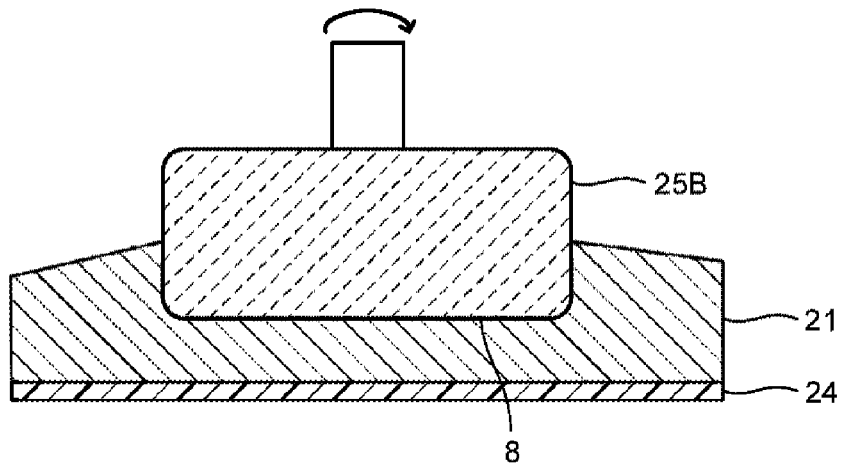
FIG. 17 is a cross-sectional view showing a second forming example of a recess for a process for manufacturing a template of an embodiment.

When the recess 8 has a planar shape of a circle as shown in FIGS. 9 and 10, for example, the circular recess 8 can be formed by grinding the glass material 21 with the use of a columnar grindstone 25A, as shown in FIG. 16. At this time, as shown in FIG. 17, a circular recess 8 having a curved corner can be formed by grinding the glass material 21 with the use of a columnar grindstone 25B having a curved outer circumferential edge. On the other hand, the recess 8 that has a planar shape of approximately a quadrangle, such as a square or a rectangle, as shown in FIGS. 12 and 13, can be formed as follows. For example, after a hard mask is formed on the second surface 23 of the glass material 21 and is then patterned into a quadrangle, the glass material 21 is etched. The curved corner of the quadrangular recess 8 can be obtained by additionally performing grinding of the glass material 21, such as filing.

Figure 14C:
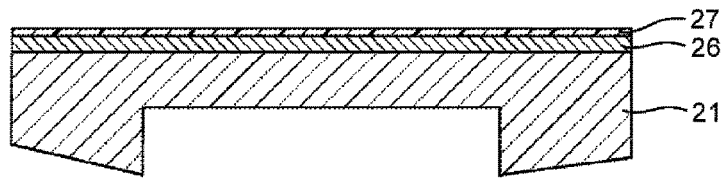
Figure 14D:
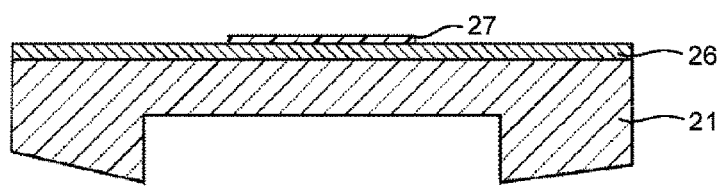
Figure 14E:
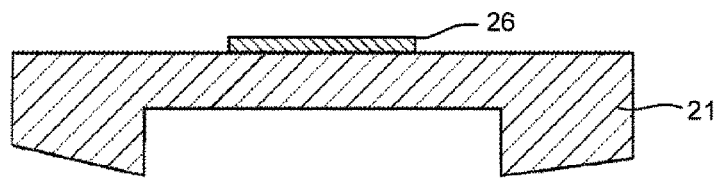
Figure 15:
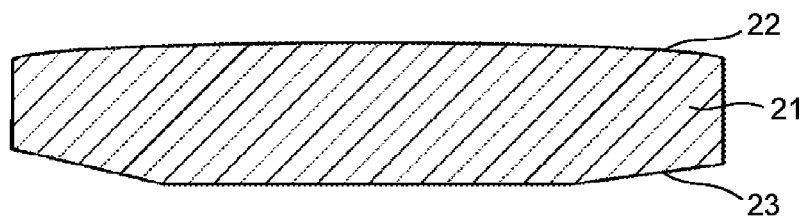
FIG. 15 is a cross-sectional view showing a modification example of a glass material used in a process for manufacturing a template of an embodiment.

Next, as shown in FIG. 14C, after the protective resin film 24 is peeled off, a hard mask 26 is formed on the first surface 22 of the glass material 21, and a resist 27 is formed thereon. The hard mask 26 functions as a mask for processing the glass material 21. The hard mask 26 comprises, for example, chromium (Cr). The resist 27 functions as a mask for processing the hard mask 26. As shown in FIG. 14D, the resist 27 is exposed to light to be developed via a stencil mask, which is not shown, whereby the resist 27 is processed into the shape corresponding to a mesa part 4. As shown in FIG. 14E, the hard mask 26 is processed into a desired shape by using the processed resist 27 as a mask. The processing of the hard mask 26 employs dry etching, such as inductively coupled plasma (ICP)—reactive ion etching (RIE) using mixed gas of chlorine ($Cl_2$) gas and oxygen ($O_2$) gas.

Figure 14F:
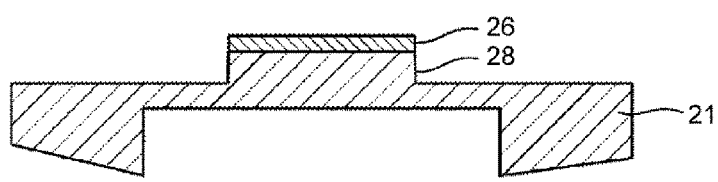
Figure 14G:
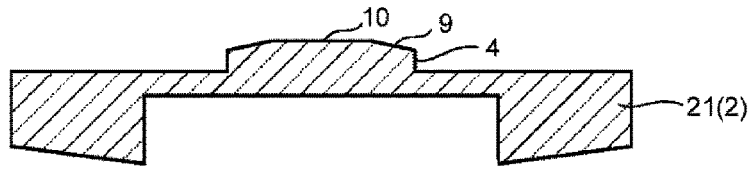

Then, as shown in FIG. 14F, the glass material 21 is processed into a desired shape by using the processed hard mask 26 as a mask, whereby a protruding base 28 to be used as the mesa part 4 is obtained. The processing of the glass material 21 employs dry etching, such as ICP-RIE using trifluoromethane ($CHF_3$) gas. The base 28 shown in FIG. 14F has a flat surface to be used as a second surface 5 of the mesa part 4. At this time, the base 28 does not have a slope region 9. As shown in FIG. 14G, such a base 28 is polished to form the mesa part 4 that has a slope region 9 and, as necessary, a flat region 10.

A recess and projection pattern 6 is formed to the mesa part 4, which has the slope region 9 and, as necessary, the flat region 10, in a manner similar to the process shown in FIGS. 14C to 14F. That is, the second surface 5, which has the slope region 9 and, as necessary, the flat region 10, is subjected to the process of forming a mask, which is not shown, and the process of etching the glass material 21 or the substrate 2, whereby the recess and projection pattern 6 is formed. This provides a template 1 that has the recess and projection pattern 6 formed on the second surface 5, which has the slope region 9 and, as necessary, the flat region 10.

Second Embodiment

Figure 18:
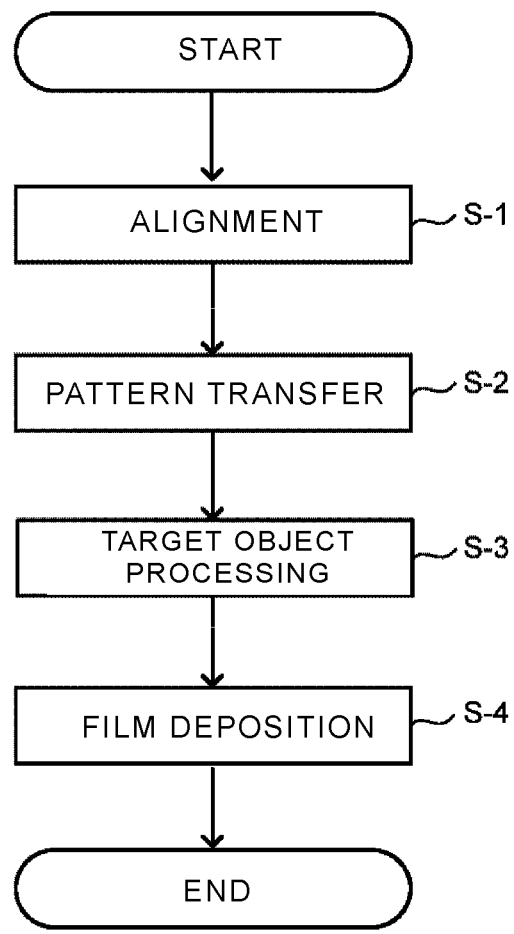
FIG. 18 is a flowchart of a method for manufacturing a semiconductor device by using a NIL process.

Next, a method for manufacturing a semiconductor device using the template 1 of the first embodiment will be described with reference to FIGS. 18 to 24. FIG. 18 is a flowchart of an example of the method for manufacturing the semiconductor device by using the NIL process. The method for manufacturing the semiconductor device shown in FIG. 18 includes an alignment process S-1, a pattern transfer process S-2, a target object processing process S-3, and a film deposition process S-4.

Figure 19:
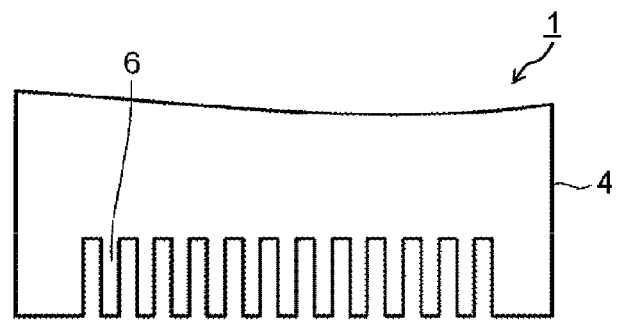
FIGS. 19-24 depict aspects of a process for manufacturing a semiconductor device by using a NIL process.
Figure 20:
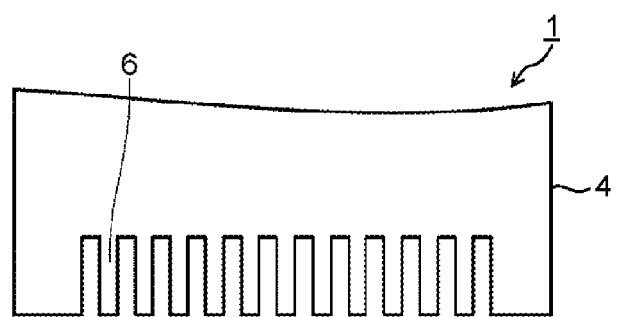

As shown in FIG. 19, the alignment process S-1 is a process for aligning a processing target surface 100a of a processing target object 100 with a pattern 6 that is provided on a mesa part 4 of a template 1 that is disposed so as to face the processing target surface 100a. The processing target object 100 is, for example, a stacked body that is formed by stacking multiple films on a semiconductor substrate. The composition of the processing target object 100 is not specifically limited. One of the templates of according to the first embodiment can be used as the template 1. As shown in FIG. 20, an imprint material layer 101 is formed by applying an imprint material to the processing target surface 100a before or after the alignment. The imprint material comprises, for example, a photo-curable resin. The imprint material is applied by, for example, ink jetting or spin coating.

Figure 21:
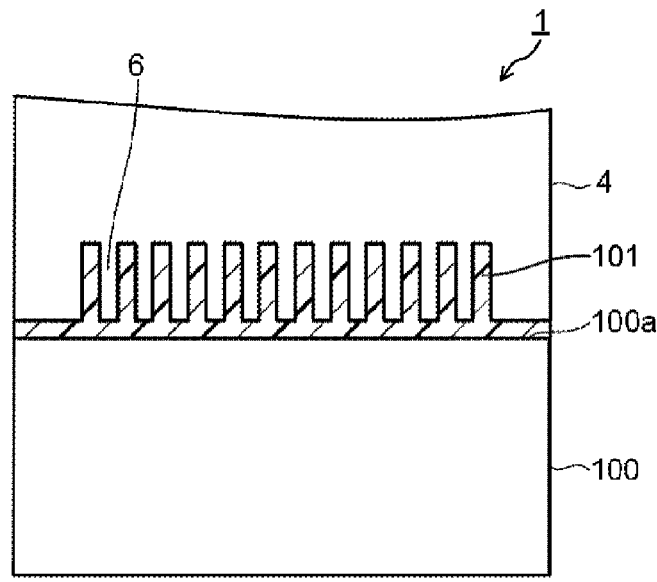
Figure 22:
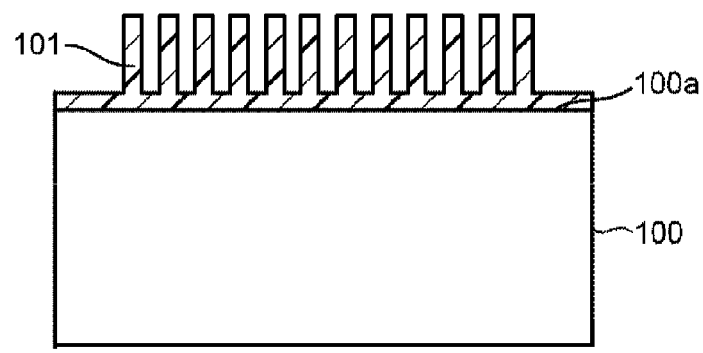

In the pattern transfer process S-2, as shown in FIG. 21, the template 1 is pressed onto the imprint material layer 101 to form a recess and projection pattern (e.g., corresponding to pattern 6), and the formed imprint material layer 101 is cured, whereby an imprint pattern is transferred to the imprint material layer 101. When the imprint material layer 101 is photo-curable resin, this layer 101 is cured with light transmitted via the template 1. As shown in FIG. 22, the template 1 is then separated from the imprint material layer 101 after the imprint material layer 101 is cured.

Figure 23:
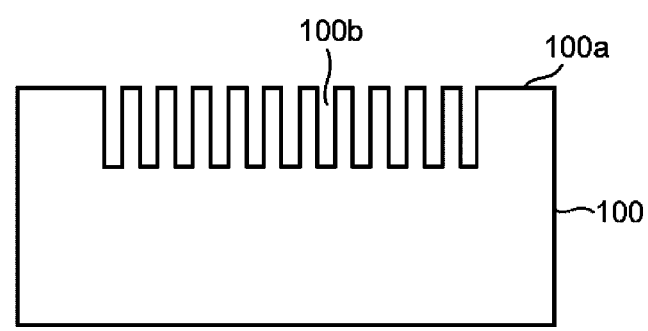
Figure 24:
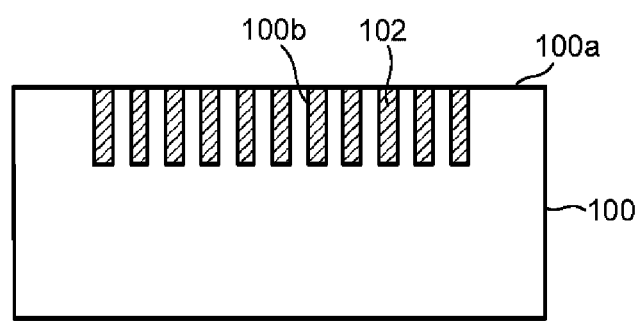

As shown in FIG. 23, the target object processing process S-3 is a process for partially processing the processing target object 100 by using the imprint material layer 101 that was patterned by the recess and projection pattern on the template 1. For example, an opening 100b is formed. The processing target object 100 is processed such that, for example, the stacked body constituting the processing target object 100 is partially removed by dry etching. The shape of the processing target object 100 after the processing depends on the shape of the imprint pattern. In the film deposition process S-4, as shown in FIG. 24, a film is deposited on the processing target object 100, and this film is processed to form a layer 102 in the opening 100b. The layer 102 that is formed in the film deposition process S-4 is, for example, a conductive layer containing a metal. For example, the layer 102 functions as an embedded wiring.

As described above, in the example of the method for manufacturing the semiconductor device of the embodiment, the slope region is provided on at least the outer circumferential region of the second surface 5 of the mesa part 4, as in the first embodiment. Thus, in pressing the recess and projection pattern 6 of the mesa part 4 onto the imprint material layer, the mesa part 4 gradually comes into contact with the imprint material layer starting from the vicinity of the center of the mesa part 4, and finally the slope region 9 comes into contact with the imprint material layer when the template 1 further pressed into the imprint material layer. As a result, the mesa part 4 comes into contact with the imprint material layer in the order from the center to the outer circumference of the mesa part 4, whereby trapping of air between the recess and projection pattern 6 of the mesa part 4 and the imprint material layer is prevented or reduced. Accordingly, it is possible to prevent stamping failures, filling failures, and the like, due to air becoming trapped in the pattern 6, in particular, due to air that that otherwise tends to become trapped in the outer circumferential region of the mesa part 4. This enables accurately transferring a pattern to the imprint material layer on the processing target object, and a semiconductor device can be obtained with high accuracy by performing the target object processing process using such a pattern.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An imprint template, comprising:
    a substrate with a first surface and a mesa part protruding from the first surface, the mesa part having a second surface with a pattern thereon, wherein
    the mesa part includes a sloped region, the second surface in the sloped region sloping downward towards the first surface to an outer edge of the mesa part when the substrate is in a non-pressurized state, at least a portion of the pattern is in the sloped region,
the mesa part includes a flat region,
the sloped region is an outer circumferential region of the second surface,
the flat region is surrounded by the sloped region, and
when an area of the flat region is a value S1 and an area of the sloped region projected to a plane parallel to the flat region is a value S2, then a ratio of the value S2 to the total of the values S1 and S2 is greater than zero but less than or equal to 0.2.

2. The imprint template according to claim 1, wherein the mesa part includes a flat region in a central portion of the second surface, the flat region being surrounded by the sloped region.

3. The imprint template according to claim 1, wherein the sloped region slopes downward at a constant angle.

4. The imprint template according to claim 1, wherein the sloped region is a gradually curving portion.

5. The imprint template according to claim 1, wherein the sloped region has a height that decreases along a direction from a center of the second surface to the outer edge of the second surface.

6. The imprint template according to claim 5, wherein
the outer edge of the second surface is at a height above the first surface, and
when the height from the outer edge to a highest part of the mesa part is a value ha, and the height of the outer edge from the first surface is a value hb, the value ha is 20% or less of the value hb.

7. The imprint template according to claim 1, wherein
the outer edge of the second surface is at a non-zero height above the first surface, and
when the height from the outer edge to a highest part of the mesa part is a value ha, and the height of the outer edge from the first surface is a value hb, the value ha is 20% or less of the value hb.

8. The imprint template according to claim 1, wherein the mesa part is a single component.

9. The imprint template according to claim 1, further comprising:
a recess in a back side of the substrate.

10. The imprint template according to claim 9, wherein the recess has a planar shape that is a circle or a quadrangle.

11. The imprint template according to claim 9, wherein the recess is a quadrangle shape having at least one rounded corner portion.

12. The imprint template according to claim 9, wherein the recess has a curved sidewall portion in a cross-section taken in a plane orthogonal to the first surface.

13. A method for manufacturing a template, comprising:
forming a first surface and a mesa part by processing a first surface of a substrate so that the mesa part protrudes from the first surface;
forming a sloped region on an outer circumferential portion of a second surface of the mesa part, the second surface in the sloped region sloping downward towards the first surface to an outer edge of the mesa part when the substrate is in a non-pressurized state; and
forming a pattern on the second surface of the mesa part, at least a portion of the pattern being in the sloped region, wherein
the mesa part includes a flat region, and
the flat region is surrounded by the sloped region, and
when an area of the flat region is a value S1 and an area of the sloped region projected to a plane parallel to the flat region is a value S2, then a ratio of the value S2 to the total of the values S1 and S2 is greater than zero but less than or equal to 0.2.

14. The method according to claim 13, further comprising:
forming a recess in a back side of the substrate.

15. The method according to claim 13, wherein the sloped region slopes downward at a constant angle.

16. The method according to claim 13, wherein the sloped region is a gradually curving portion.

17. A method of manufacturing a semiconductor device, the method comprising:
applying an imprint material to a processing target surface of a processing target object;
pressing an imprint template against the applied imprint material on the processing target surface, wherein
the imprint template comprises a substrate with a first surface and a mesa part protruding from the first surface, the mesa part having a second surface with a pattern thereon,
the mesa part includes a sloped region, the sloped region being on at least an outer circumferential portion of the second surface, the second surface in the sloped region sloping downward towards the first surface to an outer edge of the mesa part when the substrate is in a non-pressurized state, and
the sloped region is deformed by the pressing of the imprint template the applied imprint material such that outer circumferential portion of the second surface contacts the applied imprint material after a central portion of the second surface.

* * * * *